United States Patent [19]

Ooka

[11] Patent Number: 4,616,399

[45] Date of Patent: Oct. 14, 1986

[54] METHOD OF MANUFACTURING AN INSULATED GATE FIELD EFFECT TRANSISTOR

[75] Inventor: Hideyuki Ooka, Tokyo, Japan

[73] Assignee: NEC Corporation, Tokyo, Japan

[21] Appl. No.: 810,849

[22] Filed: Dec. 23, 1985

Related U.S. Application Data

[63] Continuation of Ser. No. 597,248, Apr. 5, 1984, abandoned.

[30] Foreign Application Priority Data

Apr. 11, 1983 [JP] Japan .................................. 58-63170

[51] Int. Cl.$^4$ ............................................. H01L 21/26
[52] U.S. Cl. ........................................ 29/571; 29/578; 29/577 C; 29/590; 29/576 W; 29/576 B; 148/1.5
[58] Field of Search ............ 29/571, 578, 590, 576 W, 29/576 B, 577 C; 148/1.5; 357/23 S, 23 CS

[56] References Cited

U.S. PATENT DOCUMENTS

| | | | |
|---|---|---|---|
| 4,356,623 | 11/1982 | Hunter | 29/571 |
| 4,366,613 | 1/1983 | Ogura et al. | 29/571 |
| 4,404,733 | 9/1983 | Sasaki | 29/591 |
| 4,419,809 | 12/1983 | Riseman et al. | 29/571 |
| 4,441,247 | 4/1984 | Gargini et al. | 29/571 |
| 4,503,601 | 3/1985 | Chiao | 29/571 |

FOREIGN PATENT DOCUMENTS

| | | | |
|---|---|---|---|
| 24419 | 2/1980 | Japan | 357/235 |
| 42373 | 4/1981 | Japan | 29/571 |

OTHER PUBLICATIONS

IEEE Transaction on Electron Devices, vol. Ed. 27, No. 8, 8/80, Design & Characteristics of the Lightly Doped Drain-Source (LDD) Insulated Gate Field-Effect Transistor, by: Seiki Ogura, et al.
IEEE Transactions on Electron Devices, vol. Ed. 29, No. 4, 4/82, Fabrication of High-Performance LDDFET's with Oxide Sidewall-Spacer Technology, By: Seike Ogura, et al.

*Primary Examiner*—Brian E. Hearn
*Assistant Examiner*—Hunter L. Auyang
*Attorney, Agent, or Firm*—Laff, Whitesel, Conte & Saret

[57] ABSTRACT

A method of manufacturing an insulated gate field effect transistor has first and second impurity doping processes for forming source and drain regions. In the first doping process, an impurity is lightly doped in the source and drain forming regions in self-alignment with a silicon gate pattern and a field insulating film. Next, a heat treatment is conducted so that the side surface portions of the silicon gate pattern are converted into silicon oxide films having a predetermined thickness. Thereafter, the second doping process is conducted in which an impurity is heavily doped in each part of the source and drain forming region in self-alignment with the silicon oxide films and the field insulating film. Each of source and drain region manufactured by the method has a first part of low impurity concentration adjacent to a channel region and a second part of high impurity concentration positioned between the first part and the field insulating film. The deviation of the thickness of the silicon oxide film is very small, and the length of the first part depends on that thickness. On the other hand, the length of the first part of source, drain region influences the performance of the transistor, and therefore, the method can manufacture the transistor of a stable quality.

4 Claims, 15 Drawing Figures

METHOD OF MANUFACTURING AN INSULATED GATE FIELD EFFECT TRANSISTOR

This is a continuation of U.S. patent application Ser. No. 597,248, filed Apr. 5, 1984, now abandoned.

BACKGROUND OF THE INVENTION

1. Field of the Invention

The present invention relates to a method of manufacturing an insulated gate field effect transistor (hereinafter abbreviated as IGFET), and more particularly, to a method of manufacturing an IGFET in which each of the source and drain regions is composed of a first region having a low impurity concentration and facing to a channel region and a second region having a high impurity concentration and positioned between the first region and a field region.

2. Description of the Prior Art

When an IGFET is reduced in size into minute dimensions and the channel length is shortened, a hot electron effect is produced due to rise of an electric field intensity within the channel region. Accordingly, shortening of the channel length as well as an available power supply voltage are limited. In order to resolve this problem, an IGFET in which one portions of the source and drain regions adjacent to the channel region were made to have a lower impurity concentration than the other portions, was proposed. This technique is disclosed in "IEEE TRANSACTIONS ON ELECTRON DEVICES" Vol. Ed-27, No. 8, August 1980, pp. 1359 to 1367 and "IEEE TRANSACTIONS ON ELECTRON DEVICES" Vol. Ed-29, No. 4, April 1982, pp. 590 to 596.

The former literature discloses a method in which N-type ions are injected into a P-type semiconductor substrate up to a high concentration by making use of a silicon gate electrode, a silicon nitride film on the gate electrode and a silicon oxide film thereon as a mask and then the silicon gate electrode is side-etched. Thereafter the silicon nitride film and silicon oxide film thereon are removed, and N-type impurity ions are injected into the semiconductor substrate up to a low impurity concentration by making use of the silicon gate electrode that was shortened by the side-etching as a mask. By the above-mentioned method, the portions of the source and drain regions adjacent to the channel region which is positioned under the shortened gate electrode would have a low impurity concentration over the extent corresponding to the side-etched distance of the silicon gate electrode.

However, the above-mentioned side-etching process has a large deviation in the amount of side-etching regardless of whether a wet-etching process or an isotropic dry-etching process may be employed. For instance, when a polycrystalline silicon gate electrode of 6000 Å in film thickness was subjected to side-etching by means of a HNO$_3$:HF series misture, an average amount of side-etching l was 0.33 μm. And when the absolute values of the differences between the amounts of etching of the respective samples and the average amount of etching l were added and then divided by the number of the samples and the quotient was represented by Δl, the ratio of Δl/l was about 5%. It is to be noted that in the experiments for measuring the above-defined deviation of side-etching, four semiconductor wafers were processed under the same conditions, and 36 samples were extracted from the semiconductor wafers.

The generation of a deviation of about 5% in the amount of side-etching even under the same processing conditions, implies that in the length of the region having a low impurity concentration adjacent to the channel region also, a deviation of about 5% is produced, and so, through such a method, IGFET's having a stable quality cannot be obtained. Moreover, in the case of employing side-etching as described above, the etching would proceed along grain boundaries of the polycrystalline silicon gate electrode, and hence there is a fear that the side surface configuration of the gate electrode may be deteriorated.

On the other hand, in the method disclosed in the latter literature above, at first N-type impurity ions are injected into a P-type semiconductor substrate up to a low concentration by using a polycrystalline silicon gate electrode as a mask. Subsequently, a silicon dioxide film is deposited over the entire substrate through a C.V.D. process, and then subjected to a reactive anisotropic plasma etching to form the so-called side walls from the silicon dioxide film on the opposite side surfaces of the gate electrode. Next, N-type impurity ions are injected into the substrate up to a high concentration by making use of the side walls and the gate electrode as a mask to leave the portions adjacent to the channel regions of the source and drain regions and having a low impurity concentration below the side walls. The length of these regions are therefore determined by the thickness of the side walls. However, the deviation of the thickness of the side walls is large. For instance, a silicon gate electrode of 4000 Å in film thickness was shaped in configuration, and the side surfaces and upper surface of this silicon gate electrode was covered with a thin silicon oxide film of 200 Å to 500 Å in film thickness through thermal oxidation. Subsequently, a silicon dioxide film of 4000 Å in film thickness was deposited over the entire substrate through a C.V.D. process, and then anisotropic reactive ion etching was performed. In the case of this experiment also, four semiconductor wafers were processed under the same conditions, and 36 samples were extracted from the semiconductor wafers. In this case, the length of the silicon gate electrode was varied to different values in the range of 1.0 to 2.0 μm. The thickness of the side walls is independent of the length of the silicon gate electrode and is dependent upon the thickness of the silicon gate electrode. As a result of the above-described experiments and measurements, an average thickness of the side walls L was proved to be 0.27 μm. Assuming now that the quotient of the total of the absolute values of the differences between the thickness of the side wall in the respective samples and the average thickness L divided by the number of the samples, is represented by ΔL, then the ratio of ΔL/L was as large as 18.4%. This implies that if the above-mentioned method is employed, a large deviation of about 18% would be produced in the length of the region adjacent to the channel region having a low impurity concentration even under the same conditions of processing, and so IGFET's having a stable quality cannot be obtained. Moreover, the repeated use of reactive ion etching as described above would damage the surfaces of the semiconductor substrates and would adversely affect the performance of the manufactured IGFET.

SUMMARY OF THE INVENTION

It is therefore one object of the present invention to provide a method of manufacturing an IGFET in which each of the source and drain regions includes a first region having a low impurity concentration and adjacent to the channel region and a second region having a high impurity concentration and positioned between the first region and the field region, in which method the length of the first region which influences the performance of the IGFET can be determined with a good controllability.

Another object of the present invention is to provide a method of manufacturing an IGFET of the above-mentioned type, in which upon forming the above-described first region the surface of the semiconductor substrate is not damaged nor the side surface of the silicon gate electrode is not disturbed.

According to one feature of the present invention, there is provided a method of manufacturing an IGFET comprising the steps of forming a silicon gate pattern on a gate insulating film on a center portion of an active region of one conductivity type of a semiconductor substrate, introducing an impurity of the opposite conductivity type in a first portion of the active region adjacent to one side of the center portion and in a second portion of the active region adjacent to the opposite side of the center portion to form impurity regions of the opposite conductivity type having a low impurity concentration in the first and second portions, respectively, converting the both side portions of the silicon gate pattern into silicon oxide by thermal oxidation to form a silicon gate electrode, and introducing an impurity of the opposite conductivity type in a part of the first portion separate from the center portion and in a part of the second portion separate from the center portion by using the silicon oxide on the both sides of the silicon gate electrode as a mask to form impurity regions of the opposite conductivity type having high impurity concentration in the parts of said first and second portions, respectively.

According to another feature of the present invention, there is provided a method of manufacturing an IGFET comprising source and drain regions, each of the source and drain regions including a first part of low impurity concentration adjacent to a channel region and a second part of high impurity concentration positioned between the first part and a field insulating film, the method comprising steps of forming a thin insulating film on an active region adjacent to the field insulating film, forming a polycrystalline silicon layer on the thin insulating film and on the field insulating film, patterning the silicon layer to form a silicon gate pattern on the thin insulating film, subjecting a first introducing process of an impurity into the active region by self-alignment manner with the silicon gate pattern and the field insulating film, treating thermal oxidation to form a silicon gate electrode from the silicon gate pattern and to form silicon oxide films on both side surfaces of the gate electrodes, and subjecting a second introducing process of an impurity into said active region by self-alignment manner with the silicon oxide films and the field insulating film, the amount of the impurity in the second introducing process being larger than that of the first introducing process. The first part of source, drain region may has a shallower PN junction than that of the second part to prevent the short channel effect. In the first introducing process of the impurity, the silicon gate pattern and a photo resist pattern on the gate pattern may be used as a mask. However, after the photo resist pattern has been removed, the silicon gate pattern under the condition of exposing the upper surface thereof may be used as a mask. Generally, the impurity of the opposite conductivity type is introduced through the thin insulating film or directly into the active region to form the lower or the higher part of source, drain region through an ion implantation process. However, thermal diffusion method may be used for introducing the impurity. In the above-featured method, upon forming a thermally oxidized silicon dioxide films on the side surfaces of the silicon gate electrode, if an antioxidant film such as a silicon nitride film or the like has been preliminarily deposited on the silicon gate pattern, then a gate electrode having a predetermined low resistance can be obtained because the thickness of the silicon gate electrode is not reduced by the thermal oxidation.

According to the above-featured present invention, a deviation of the length of the first region adjacent to the channel region in the source or drain region, that is, the length of the region having a low impurity concentration, is determined by a deviation of the film thickness of the silicon dioxide films formed by thermal oxidation on the side surfaces of the silicon gate electrode. According to the experiments conducted by the inventor of this invention, it has been confirmed that the deviation of this film thickness is very small. More particularly, in the experiments, a plurality of silicon gate electrodes having a film thickness of 9000 Å and a sheet resistivity of 9Ω/□ and deposited on a gate insulator film of 500 Å in thickness were formed on a semiconductor wafer. Ten such semiconductor wafers were thermally oxidized under the same conditions, that is, at 900° C., for 30 minutes within a steam, then 3 samples from each wafer, that is, 30 samples in total were extracted, and a film thickness of the thermally oxidized film was measured for each sample. An average value t of the film thicknesses was 0.25 μm. Assuming that the quotient of the total of the absolute values of the differences between the film thicknesses of the respective samples and the average value t divided by the number (30) of the samples, is represented by Δt, then Δt/t had a very small value of 2.4%. Hence, according to the above-featured method of the present invention, the first region having a small deviation value can be expected. Moreover, according to the present invention, since a side-etching process is not employed, the surface condition of the side surfaces of the silicon gate electrode is good, and also since a reactive ion etching process is not used, the surface condition of the semiconductor substrate is favorable.

DETAILED DESCRIPTION OF THE PRIOR ART

Figure 1:
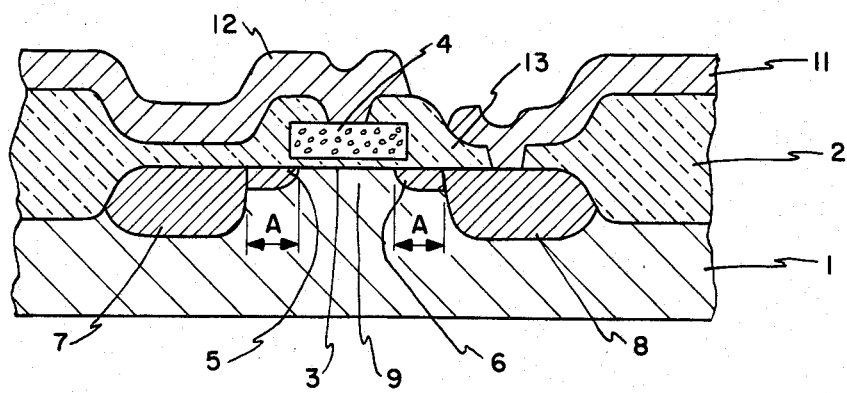
FIG. 1 is a cross-sectional view showing an IGFET to which the present invention is directed.

In FIG. 1, an IGFET is formed in an active region of a semiconductor substrate 1 of one conductivity type, for instance, of P-type that is adjacent to thick field oxide films 2. In this IGFET, a polycrystalline silicon gate electrode 4 is provided via a gate insulating film 3 on a channel region 9 and connected to a lead-out wiring layer 12. The drain region is composed of a first region 6 of the opposite conductivity type, for instance of N-type and having a low impurity concentration and a shallow PN-junction, and a second region 8 of the opposite conductivity type, for instance of N-type and having a high impurity concentration and a deep PN-junction. Also, the source region is composed of a first region 5 of the opposite conductivity type and having a low impurity concentration and a shallow PN-junction and a second region 7 of the opposite conductivity type and having a high impurity concentration and a deep PN junction. A lead-out wiring layer 11 made of aluminum or the like is connected through a contact hole in a insulating film 13 to the second region of the drain region. Also, a lead-out wiring layer (not shown) is connected to the second region of the source region. Therefore, each second region must has the high impurity concentration to realize good ohmic contact and low electrical resistance, and the deep PN junction to avoid a alloy-spike phenomenon, and to realize low electrical resistance.

On the other hand, each first region positioned between the channel region and the second region must has the low impurity concentration to eliminate the hot electron effect produced in the IGFET which is reduced in size and the channel length is shortened. Especially the first region of the drain region is important because a high voltage is applied on the side of the drain. Moreover, when a short channel effect must be avoided, the first region may has a shallow PN junction.

Accordingly, in such type of IGFET's, the performance of the IGFET is determined by the first regions. Hence, for the purpose of obtaining an IGFET having a stable quality, especially a length A of the first regions 5, 6 must be maintained constant. In other words, the above-referred length A must have a constant value among the respective devices, that is, a deviation of the length A among the respective devices must be small.

A method of manufacturing the IGFET shown in FIG. 1 in the prior art will be explained with reference to FIGS. 2A to 2D.

Figure 2A:
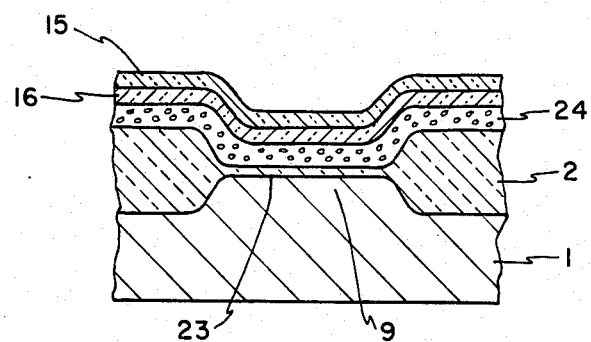
FIGS. 2A to 2D are cross-sectional views showing successive steps in a method of manufacturing an IGFET in the prior art.
Figure 2C:
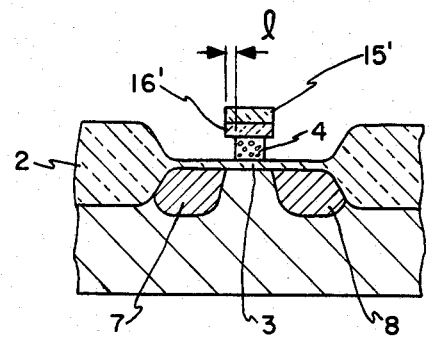
Figure 2B:
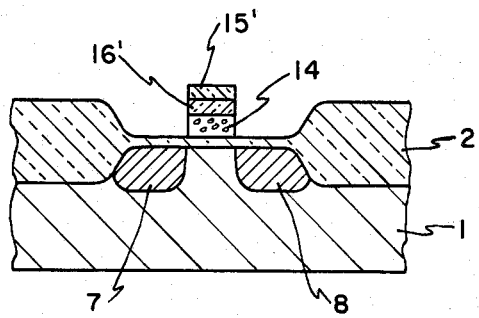
Figure 2D:
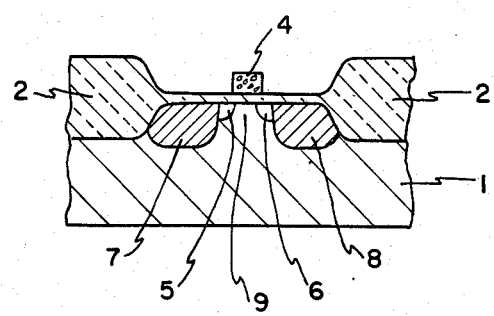

At first, as shown in FIG. 2A, a silicon oxide film 23 of 500 Å in thickness serving as a gate insulating film is formed on a P-type semiconductor substrate 1 which is isolated by thick field oxides film 2 formed through a selective oxidation process. Subsequently, a polycrystalline silicon film 24 of 6000 Å in thickness, a silicon nitride film 16 and a silicon oxide film 15 are successively deposited on the oxide film 23. Thereafter, the above-mentioned multi-layer films are patterned through a photo-etching process to form a gate region having a laminated structure of polycrystalline silicon film 14 - silicon nitride film 16'- silicon oxide film 15', and then N+-type second regions 7 and 8 of the source and drain regions, respectively, are formed by ion-implanting phosphorus or arsenic with the above-mentioned gate regions and the field oxide films 2 used as a mask, as shown in FIG. 2B. Then, as shown in FIG. 2C, the polycrystalline silicon layer is side-etched through a wet etching process by making use of a etchant having a larger selective etching ratio for the polycrystalline silicon layer than for the silicon nitride film 16' such as, for example, a $HNO_3$:HF series etchant liquid. Subsequently, as shown in FIG. 2D, after the silicon dioxide film 15' and the silicon nitride film 16' of the mask have been removed, shallow $N^-$-type diffused layers, that is, the first regions 5, 6 in the source and drain regions, respectively, are formed through ion-implantation of phosphorus by making use of the previously side-etched polycrystalline silicon gate electrode 4 and the field oxide films 2 as a mask. Thereafter, a conventional process is carried out and eventually the structure shown in FIG. 1 is obtained.

However, in the above-described method in the prior art, since the length of the $N^-$-type diffused layers indicated by character A in FIG. 1 is determined by the amount of side-etching of the polycrystalline silicon gate electrode, controllability of the length A of these second regions is bad, and hence reproducibility of a performance of the devices becomes an issue. In addition, the manufacturing process becomes complexed. In other words, the above-described amount of side-etching l has a large deviation value among the respective devices regardless of whether a wet etching process is employed or an isotropic dry etching process is employed.

Figure 3A:
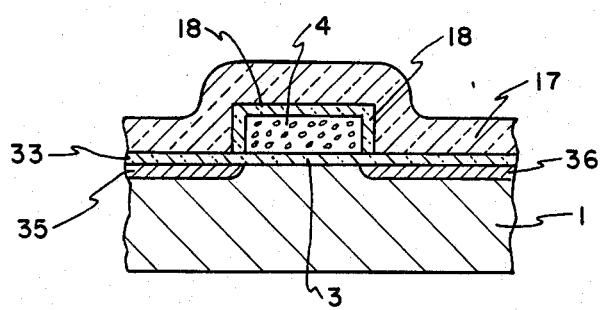
FIGS. 3A and 3B are cross-sectional views showing principal steps extracted from another method of manufacturing an IGFET in the prior art.
Figure 3B:
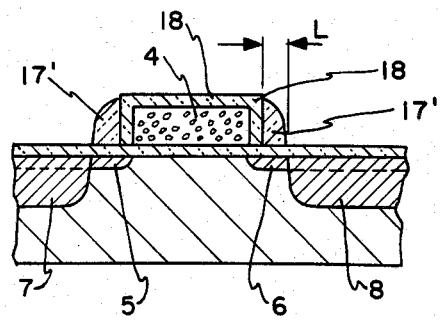

On the other hand, in the method of manufacturing IGFET's in the prior art shown in FIGS. 3A and 3B, a polycrystalline silicon gate electrode 4 of 4000 Å in thickness is formed via a gate insulating film 3 of 500 Å in thickness on a P-type silicon substrate, and then $N^-$-type shallow impurity regions 35, 36 are formed within the silicon substrate through an ion-implantation process by making use of the polycrystalline silicon gate electrode 4 as a mask. Then, after the silicon gate electrode 4 has been covered with a silicon oxide film 18 that is as thin as 200 to 500 Å through a thermal oxidation process, a thick silicon dioxide film 17 of about 4000 Å in thickness is deposited over the entire substrate through a C.V.D. process (See FIG. 3A). Next, the substrate is subjected to anisotropic reactive ion etching to make side walls 17' made of the silicon dioxide film 17 remain on the opposite side surfaces of the silicon gate electrode 4. Subsequently, second regions 7 and 8 in the source and drain regions, respectively, are formed by injecting an N-type impurity into the substrate up to a high concentration through an ion-implantation process by making use of the side walls 17' as a mask. Then the portions 5, 6 of the $N^-$-type regions 35, 36 located under the side walls 17' remain and become the first regions in the source and drain regions, respectively (See FIG. 3B). In this case, the length A (FIG. 1) of the first regions in the manufactured IGFET is determined by the thickness L of the side walls 17', and since this thickness L has a large deviation among the respective devices, after all the manufactured IGFET's would have an unstable quality.

DESCRIPTION OF PREFERRED EMBODIMENTS

Now, a first preferred embodiment of the method of manufacturing an IGFET according to the present invention will be described.

Figure 4A:
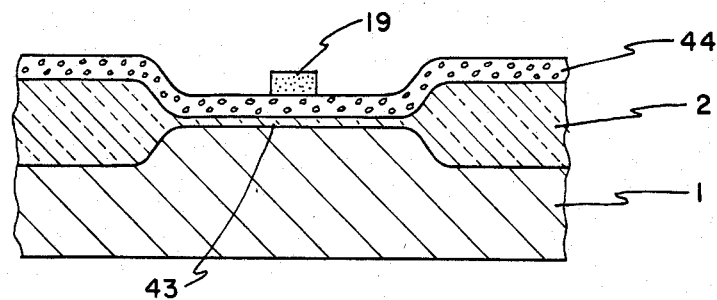
FIGS. 4A to 4D are cross-sectional views showing successive steps in a method of manufacturing an IGFET according to a first preferred embodiment of the present invention.

At first, as shown in FIG. 4A, after a silicon oxide film 43 of 500 Å in thickness serving as a gate insulating film has been formed on an active region of a silicon semiconductor substrate 1 of one conductivity type, for instance, of P-type that is adjacent to a thick field oxide films 2, a polycrystalline silicon film 44 is deposited over the gate oxide film 43 and the field oxide film 2. This silicon film 44 has a thickness of 9000 Å and its sheet resistivity is 9Ω/□. Next, a photo-resist pattern 19 for forming a silicon gate pattern is provided through the technique of photolithography or the like.

Figure 4B:
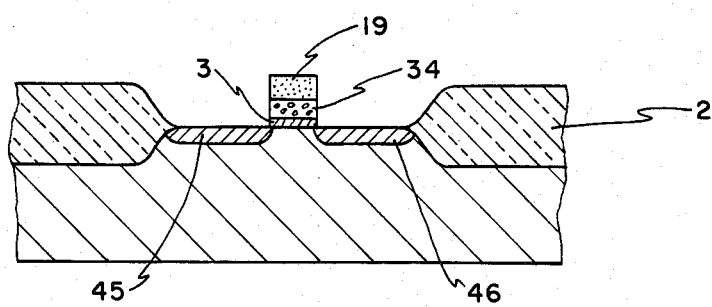

Subsequently, as shown in FIG. 4B, the polycrystalline silicon film 44 is subjected to anisotropic dry etching by employing the photo-resist pattern 19 as a mask to form a silicon gate electrode pattern 34 and also the portions the gate insulating film 43 above the regions where a source and a drain are to be formed, are removed. Next, arsenic is injected into the intended source and drain forming regions up to a low concentration through an ion-implantation process by making use of the resist pattern 19 or silicon gate electrode pattern 34 and the field oxide films 2 as a mask and forms $N^-$-impurity regions 45, 46 of low impurity concentration. The conditions for the ion-implantation are, for instance, an acceleration energy of 150 KeV and a dose of $5 \times 10^{13}$ cm$^{-2}$ to $1 \times 10^{14}$ cm$^{-2}$. In this case, the photoresist 19 may be removed before the ion injection and the exposed silicon gate electrode pattern 34 may be used as the mask. Also, the insulating film 43 above the regions where the source and drain region to be formed may remain and through the insulating film 43 the ion injection can be conducted.

Then, silicon oxide films 20 of 0.25 μm in thickness are formed on the side surfaces of the polycrystalline silicon gate electrode 4 by carrying out thermal oxidation at 900° C. for 30 minutes within a steam. During this period, a thermally oxidized film of a similar thickness is formed also on the upper surface of the silicon gate electrode 4, and on the source and drain regions are also formed thermally oxidized films 28 of about 700 Å in thickness. During this thermal oxidation process, since the polycrystalline silicon gate pattern 34 is consumed by a thickness of 0.12 μm on one side, after all the gate electrode 4 would be thinned by a length of 0.24 μm in total on the both sides from the silicon gate pattern 34. Thus with respect to one side, since silicon of 0.12 μm in thickness was thermally oxidized and a thermally oxidized film 20 of 0.25 μm in thickness was produced, after all the side surfaces of the thermally oxidized film 20 in FIG. 4C would project by a distance of 0.13 μm with respect to the side surfaces of the silicon gate pattern 34 in FIG. 4B.

Figure 4C:
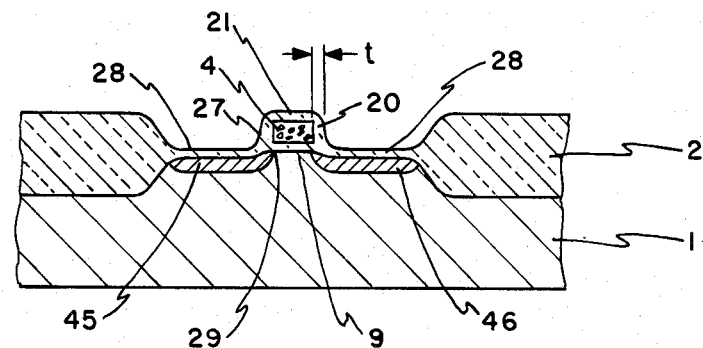

Subsequently, drive-in is performed within a nitrogen atmosphere at 1000° C. for 2 hours. During this step of the process, the $N^-$-type regions 45, 46 are increased in depth to a certain extent and at the same time diffused also in the lateral directions, resulting in approximate coincidence in a plan configuration between the edges 29 of the $N^-$-type regions 45, 46 and the side edges 27 of the silicon gate electrode 4 which was thinned through the thermal oxidation process. The above-mentioned step of the process is illustrated in FIG. 4C.

Thereafter, phosphorus is injected into the substrate through an ion-implantation process at an acceleration energy of 100 KeV and at a dose of $5 \times 10^{15}$ cm$^{-2}$ by making use of the field oxide films 2 and the silicon oxide films 20 on the side surfaces of the silicon gate electrode 4 as a mask, and then annealing is carried out within a nitrogen atmosphere at 900° C. for 10 minutes. This annealing is carried out for the purpose of activating the injected ions and to form region 7, 8, and since it is carried out at a lower temperature for a shorter period than the drive in illustrated in FIG. 4C, diffusion of the introduced high-concentration phosphorus in the lateral directions become very small. Through the above-mentioned method, the second regions 7 and 8 in the source and drain regions, respectively, are formed to have a high impurity concentration of $10^{20}$ to $10^{21}$ cm$^{-3}$ and a deep PN-junction, while the first regions located between these second regions 7, 8 and the channel region 9 are formed to have a low impurity concentration of about $10^{18}$ cm$^{-3}$ and a shallow PN-junction.

According to the method of the present invention as described above, the length A (FIG. 1) of the first regions which directly influence the performance of the IGFET is determined by the thickness t of the thermally oxidized films 20 on the side surfaces of the silicon gate electrode 4. However, since the thermally oxidized films 20 can be formed with a very good controllability for the film thickness and the deviation in the film thickness among the respective devices is small as described previously, the IGFET's manufactured through the method according to the present invention have a stable quality. Moreover, owing to the fact that neigher side-etching of the silicon gate electrode nor reactive ion etching for forming the side walls is employed as is the case with the prior art technique, the states of the side surfaces of the silicon gate electrode and the surface of the silicon substrate are very good. In addition, since the length of the second regions can be determined only by the thermal oxidation process, the method of manufacture is simplified.

Now a second preferred embodiment of the present invention will be described with reference to FIGS. 5A to 5D. In FIGS. 5A to 5D, component parts having the same functions as those shown in FIGS. 4A to 4D are given like reference numerals. Also it is to be noted that the conditions for the configurations of these component parts are nearly identical in FIGS. 4A to 4D and in FIGS. 5A to 5D. Only difference between these two embodiments resides in that an antioxidant coating film such as, for example, a silicon nitride film 22 of about 1000 Å in thickness is provided on the polycrystalline silicon layer 64. In the first preferred embodiment, upon thermal oxidation of the side surfaces of the silicon gate electrode pattern, a thermally oxidized film is formed also on the upper surface of the silicon gate electrode. Accordingly, the silicon gate electrode is thinned by the thermal oxidation, and therefore, a thick polycrystalline silicon film of 9000 Å in thickness, which is eventually formed into a silicon gate electrode, must be preliminarily provided. However, in view of easiness in the patterning of the gate electrode pattern, preferably the polycrystalline silicon film should be as thin as possible. Accordingly, in the second preferred embodiment, a polycrystalline silicon film 64 having a film thickness of 6000 Å and a sheet resistivity of 13Ω/□ is employed. By using the photo-resist 19 as a mask, a silicon gate pattern 54 and a silicon nitride film pattern 22' are formed as shown in FIGS. 5A and 5B. Next thermally oxidized films 30 are formed on the side surface of the silicon gate electrode 4 in the step shown in FIG. 5C. In this case, the silicon nitride film 22' is provided on the upper surface of the silicon gate electrode, the upper surface of this silicon gate electrode 4 is not oxidized and hence the initial film thickness of 6000 Å can be maintained. This silicon nitride film is removed after formation of the thermally oxidized films 30 on the side surfacesof the silicon gate electrode 4, and a thin oxide film 31 can be formed on the upper surface of the silicon gate electrode 4 in an additional step of the process, as shown in FIG. 5D.

Alternatively, an IGFET could be completed with this silicon nitride film 22' left in itself.

Figure 4D:
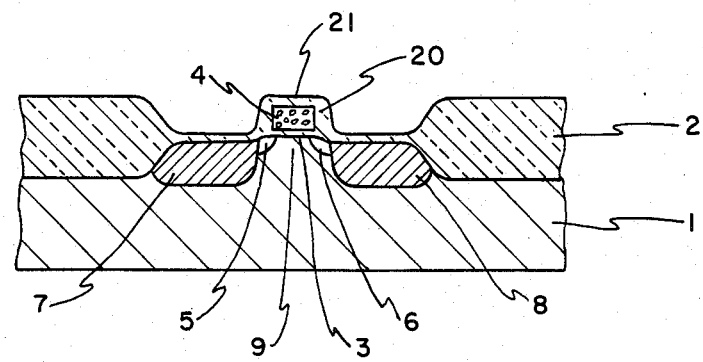
Figure 5A:
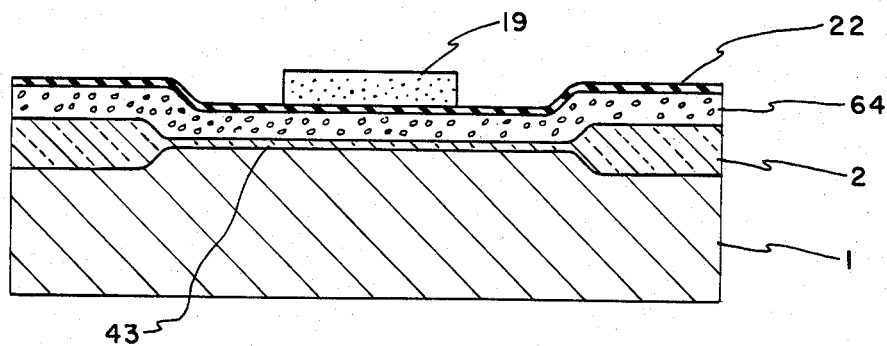
FIGS. 5A to 5D are cross-sectional views showing successive steps in a method of manufacturing an IGFET according to a second preferred embodiment of the present invention.
Figure 5B:
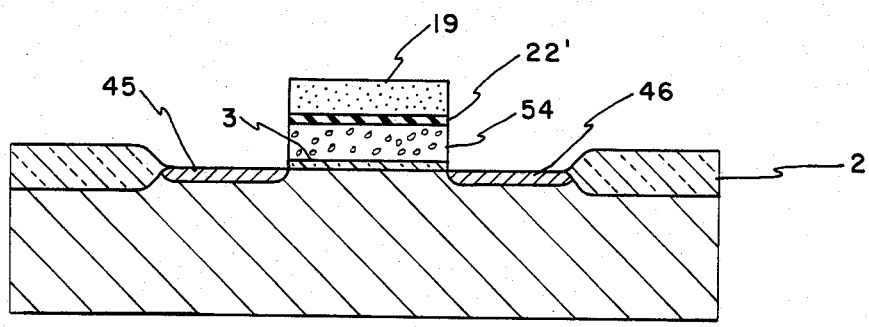
Figure 5C:
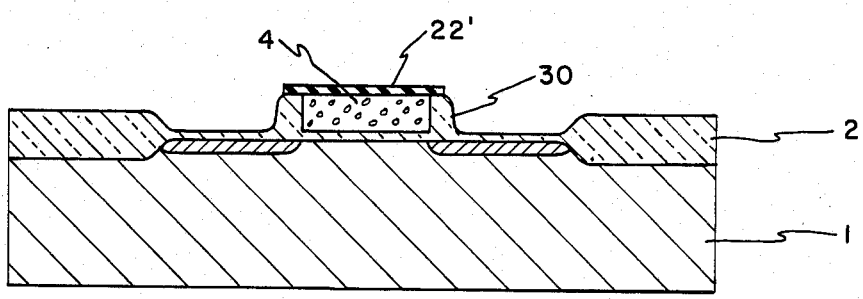
Figure 5D:
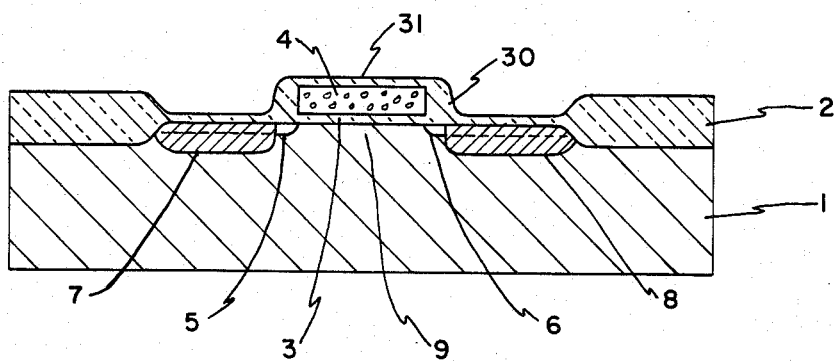

After the step shown in FIG. 4D or in FIG. 5D, the IGFET shown in FIG. 1 can be provided by performing the steps in the conventional manufacturing process of IGFET's. More particularly, a passivation film is deposited over the entire surface of the substrate, then contract holes are opened in the passivation film, and source and drain lead-out electrodes as well as a gate lead-out electrode are formed.

While the preferred embodiments of the present invention have been described in connection to an N-channel type IGFET in which N-type source and drain regions are formed within a P-type semiconductor substrate, the method of manufacture according to the present invention is equally applicable to a P-channel type IGFET in which P-type source and drain regions are formed within an N-type semiconductor substrate. As a matter of course, the present invention is equally applicable to either enhancement type or depletion type IGFET's.

What is claimed is:

1. A method of manufacturing an insulated gate field effect transistor comprising the steps of forming a polycrystalline silicon gate pattern on a gate insulating film in a central portion of an active region of one conductivity type of a semiconductor substrate, said active region abutting against a field oxide film formed on a major surface of said substrate, introducing an impurity of the opposite conductivity type in a first portion of said active region adjacent to one side of said central portion and to said field oxide film and in a second portion of said active region adjacent to the opposite side of said central portion and to said field oxide film to form impurity regions of the opposite conductivity type having a low impurity concentration in the entire surface areas of said first and second portions, respectively, converting both of the side portions of said polycrystalline silicon gate pattern into silicon oxide by thermal oxidation to form a polycrystalline silicon gate electrode under a condition of any antioxidant film being free on said first and second portions, and under such a condition that the upper surface of said polycrystalline silicon gate is exposed, and introducing an impurity of the opposite conductivity type in a part of said first portion which is separate from said central portion and in a part of said second portion which is separate from said central portion by using said polycrystalline silicon oxide on both sides of said silicon gate electrode as a mask to form impurity regions of the opposite conductivity type having high impurity concentration in said parts of said first and second portions, respectively, said last introducing process being conducted under a condition of an exposure of said silicon oxide converted from said side portions of said polycrystalline silicon pattern.

2. The method of manufacturing an insulated gate field effect transistor of claim 1 further comprising an annealing step after said converting step so that the edge of said polycrystalline silicon gate electrode after said thermal oxidation may approximately coincide with the edge of said imputity regions having low impurity concentration as viewed in a plan configuration.

3. A method of manufacturing an insulated gate field effect transistor of claim 1, in which said impurity regions having low impurity concentration is formed through an ion implantation process.

4. A method of manufacturing an insulated gate field effect transistor of claim 1, in which said impurity regions having a high impurity concentration is formed through an ion implantation process.

* * * * *